(12) United States Patent
Leobandung et al.

(10) Patent No.: US 6,429,488 B2
(45) Date of Patent: Aug. 6, 2002

(54) DENSELY PATTERNED SILICON-ON-INSULATOR (SOI) REGION ON A WAFER

(75) Inventors: Effendi Leobandung, Wappingers Falls; Devendra K. Sadana, Pleasantville; Dominic J. Schepis, Wappingers Falls; Ghavam G. Shahidi, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/791,273

(22) Filed: Feb. 22, 2001

Related U.S. Application Data

(62) Division of application No. 09/193,606, filed on Nov. 17, 1998.

(51) Int. Cl.[7] .............................................. H01L 27/12
(52) U.S. Cl. ...................... 257/354; 438/413; 438/478; 438/479; 257/296; 257/347
(58) Field of Search ................................ 438/478, 479, 438/413; 257/347, 296, 354

(56) References Cited

U.S. PATENT DOCUMENTS

| | | | |
|---|---|---|---|
| 4,502,913 A | 3/1985 | Lechaton et al. | |
| 4,661,832 A | 4/1987 | Lechaton et al. | |
| 4,758,531 A | 7/1988 | Beyer et al. | |
| 4,960,726 A | 10/1990 | Lechaton et al. | |
| 5,049,521 A * | 9/1991 | Belanger et al. | |
| 5,086,016 A | 2/1992 | Brodsky et al. | |
| 5,279,987 A | 1/1994 | Lechaton et al. | |
| 5,298,784 A | 3/1994 | Gambino et al. | |
| 5,314,840 A | 5/1994 | Schepis et al. | |
| 5,394,294 A | 2/1995 | Mei et al. | |
| 5,399,507 A | 3/1995 | Sun | |
| 5,444,287 A | 8/1995 | Bezama et al. | |
| 5,476,809 A * | 12/1995 | Kobayashi | |
| 5,485,032 A | 1/1996 | Schepis et al. | |
| 5,504,434 A | 4/1996 | Schepis et al. | |
| 5,585,663 A | 12/1996 | Bezama et al. | |
| 5,597,738 A | 1/1997 | Kurtz et al. | |
| 5,614,440 A | 3/1997 | Bezama et al. | |
| 5,622,892 A | 4/1997 | Bezama et al. | |
| 5,631,186 A * | 5/1997 | Park et al. | 438/155 |
| 5,726,089 A * | 3/1998 | Okonogi | 438/405 |
| 5,740,099 A | 4/1998 | Tanigawa | |
| 5,759,907 A | 6/1998 | Assaderaghi et al. | |
| 5,811,357 A | 9/1998 | Armacost et al. | |
| 5,909,626 A * | 6/1999 | Kobayashi | 438/406 |

FOREIGN PATENT DOCUMENTS

JP 3-173175 A 7/1991

OTHER PUBLICATIONS

*Process for Fabrication of Very Thin Epitaxial Silicon Films Over Insulating Layers*, IBM Technical Disclosure Bulletin, vol. 35, No. 2, pp. 247–249 (Jul. 1992).
English Abstract of JP 3–173175A.

* cited by examiner

Primary Examiner—Trung Dang
(74) Attorney, Agent, or Firm—Ratner & Prestia; Joseph P. Abate, Esq.

(57) ABSTRACT

A process for making a SOI region and a bulk region in a semiconductor device. The process includes providing a SOI structure. The SOI structure has a thin silicon layer, a buried insulating oxide layer underlying the thin silicon layer, and a silicon substrate underlying the buried insulating oxide layer. Next, a nitride layer is deposited on top of the SOI structure. The SOI structure is exposed by selectively etching portions of the nitride layer. The portion of the nitride layer which is not etched forms the SOI region. The silicon substrate is exposed by selectively etching the remaining portion of the exposed SOI structure. An epitaxial layer is grown on top of the exposed silicon substrate to form the bulk region. The nitride portion above the SOI structure is finally removed.

14 Claims, 3 Drawing Sheets

DENSELY PATTERNED SILICON-ON-INSULATOR (SOI) REGION ON A WAFER

This application is a divisional of U.S. patent application Ser. No. 09/193,606, filed on Nov. 17, 1998, which has been allowed.

TECHNICAL FIELD

The present invention relates, in general, to the process of making a semiconductor device and, more specifically, to a process of making a semiconductor device having a silicon-on-insulator (SOI) region and a non-SOI (bulk) region.

BACKGROUND OF THE INVENTION

A silicon-on-insulator (SOI) structure is formed when a buried insulating layer electrically isolates a silicon layer from a silicon substrate. The SOI structure does not usually occupy the entire surface of the silicon substrate. Such a selective SOI structure is disclosed by Tanigawa in U.S. Pat. No. 5,740,099, issued Apr. 14, 1998. There shown is an integrated circuit fabricated partially on the SOI structure and partially on the silicon substrate. The circuit area assigned to the SOI structure is referred to as the SOI region, and the circuit area assigned outside the SOI structure is referred to as the bulk region. Tanigawa teaches building regions of SOI and bulk silicon on a substrate and fabricating different types of circuits in each region. Tanigawa uses a patterned ion implant technique to build the different regions. For example, a very high dose of oxygen ions is implanted deep within the silicon at sufficient energy to form the buried layer of silicon dioxide.

Tanigawa's method has several drawbacks. A high dose of oxygen is required to form a sharp $Si/SiO_2$ interface and high energy of implantation is required to achieve the buried layer. This method is also known to cause defects at all of the patterned edge regions and usually results in a non-planar structure because oxidation causes expansion of the SOI portion of the wafer.

Another publication, titled "Process for Fabrication of Very Thin Epitaxial Silicon Films Over Insulating Layers," IBM Technical Disclosure Bulletin, Volume 35, No. 2, pages 247–49 (July 1992) (author unknown), teaches the use of selective epitaxial growth of silicon to grow regions of SOI on a wafer. As shown in FIG. 1a of the publication (also FIG. 1a of this specification), two mask levels are used to create structure 40 which includes silicon substrate 42 and insulating oxide layer 44. Oxide opening 48 is formed from a first masking process, and the height of the center portion of the oxide layer, island 50, is controlled by a second masking process.

Next, epitaxial silicon 46 is grown selectively as shown in FIG. 1b. A chemical-mechanical polish is used to remove the excess epitaxial material. Insulating oxide layer 44 acts as a reference point for the chemical-mechanical polish, so that the remaining epitaxial silicon ends up flush with the oxide layer, as shown in FIG. 1c. In this manner, the SOI region is formed to make the silicon island 50 completely isolated from the insulating oxide layer 44.

This process, known as epitaxial lateral overgrowth (ELO), has its drawbacks. The area of SOI formed may only be up to approximately 10 microns thick. The size and quality of silicon is limited when the SOI formed is wider then 10 microns in regions 52 of FIG. 1c. Consequently, the amount of SOI devices on a wafer is also limited.

It is necessary to combine both logic and dynamic random access memory (DRAM) circuitry, for example, in the same chip in order to make a high-performance microprocessor. A SOI structure is one of the possible candidates for fabricating a high-performance microprocessor. It is difficult to make high-performance DRAM cells on SOI, however, because of lack of substrate connection for the DRAM pass transistors. The lack of substrate connection results from the inability to grow SOI that is sufficiently wide to allow fabrication of many DRAM cells on a single island of SOI. Because many islands of SOI need to be grown, a common substrate is lacking. Lack of a common substrate may also cause floating body effects and severe cell leakages, thereby degrading DRAM performance.

In U.S. Pat. No. 5,399,507 issued to Sun on Mar. 21, 1995, a process is disclosed for fabricating a mixed thin film and bulk semiconductor substrate. A thin film over the SOI structure is masked and etched to expose the underlying bulk substrate. An epitaxial layer is then grown to build the exposed bulk portion to form the mixed substrate. Before growing the epitaxial layer, however, Sun teaches (1) that a dielectric layer be deposited over the entire substrate, and (2) that the dielectric layer be selectively etched to form sidewall spacers in order to separate the SOI region from the bulk region in the substrate.

After completing the aforementioned two steps, Sun grows the epitaxial layer over the bulk region. Finally, Sun forms a shallow trench isolation (STI) region within the SOI region, and another STI region within the bulk region. Thus, Sun teaches how to form a mixed SOI region and a bulk region on a single substrate. The drawback in Sun's process is that many steps are required to separate the two regions. Specifically, Sun requires the formation of the sidewall spacers, in addition to the conventional step of forming the STI regions. Moreover, as shown in FIG. 11 of Sun's disclosure, STI region 54 is formed over the bulk region and STI region 52 is formed over the SOI region. Both STIs are formed adjacent to wall spacer 46. Forming the trenches for the STIs is difficult because the spacer abuts the STIs.

The deficiencies of conventional processes in making SOI and bulk regions on the same wafer, and the difficulties in making high-quality, densely patterned SOI regions suitable for microprocessors, show that a need still exists for a process which can make densely patterned SOI for merged logic and DRAM circuitry, or for other types of circuitry.

SUMMARY OF THE INVENTION

To meet this and other needs, and in view of its purposes, the present invention provides a process for making densely patterned SOI on a wafer. In one embodiment, the process includes making a SOI region and a bulk region in a semiconductor device. The process includes providing a SOI structure having a thin silicon layer, a buried insulating oxide layer underlying the thin silicon layer, and a silicon substrate underlying the buried insulating oxide layer. Next, a nitride layer is deposited on top of the SOI structure. The SOI structure is exposed by selectively etching portions of the nitride layer. The portion of the nitride layer which is not etched forms the SOI region. The silicon substrate is exposed by selectively etching the remaining portion of the exposed SOI structure. An epitaxial layer is grown on top of the exposed silicon substrate to form the bulk region. The nitride portion above the SOI structure is finally removed. A logic circuit may be formed above the SOI region and a DRAM circuit may be formed above the bulk region.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1A:
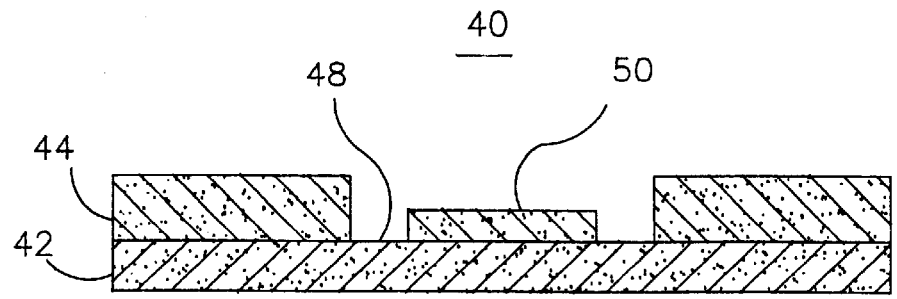
FIGS. 1a–1c are cross-sectional views showing a process sequence for fabricating a prior art semiconductor device to grow regions of SOI on a wafer.
Figure 1B:
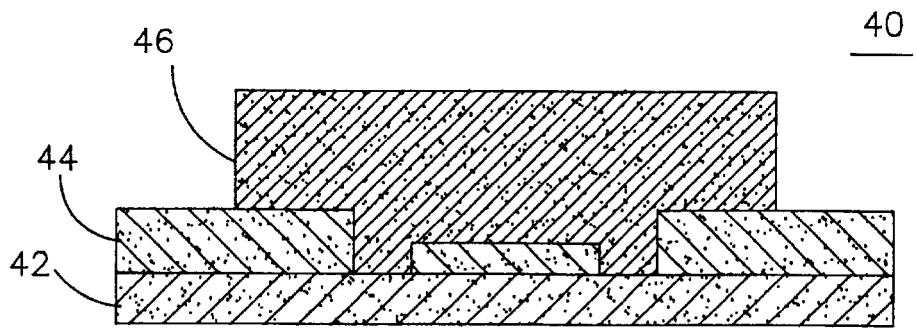
Figure 1C:
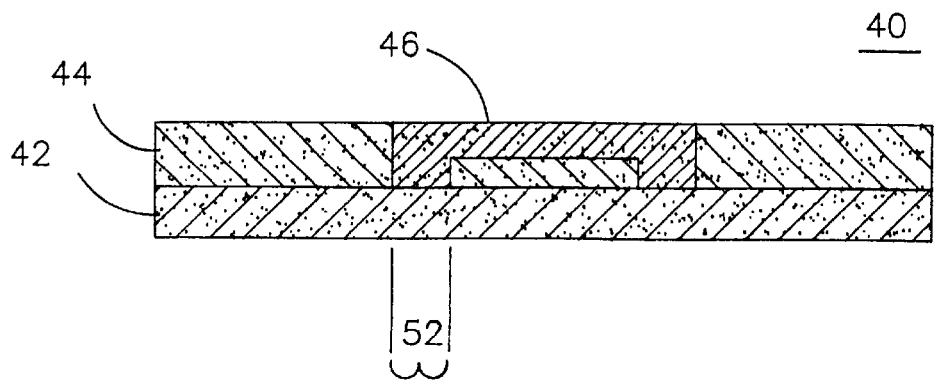
Figure 2A:
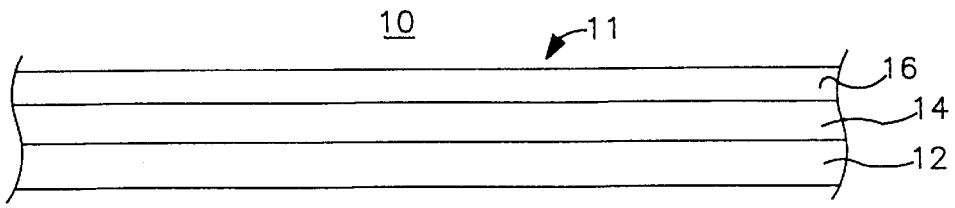
FIGS. 2a–2h are cross-sectional views showing a process for fabricating a semiconductor device to make densely patterned SOI on a wafer according to this invention.
Figure 2B:
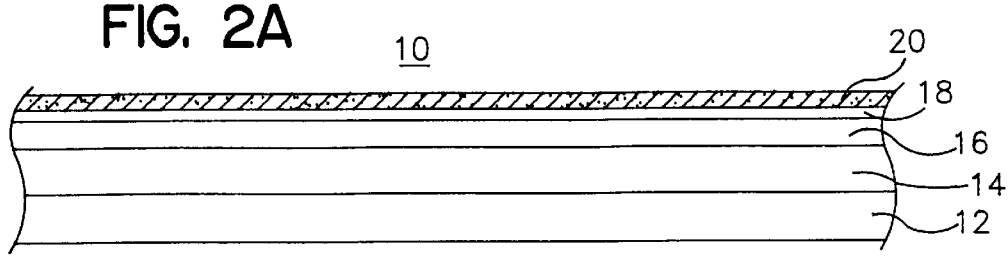

Referring to FIGS. 2a and 2b of the drawing, a process for making densely patterned SOI regions in wafer 10 is shown. Wafer 10 has both SOI regions and non-SOI (or bulk) regions on substrate 12. The process sequence starts with preparation of semiconductor substrate 12, which is a single crystal silicon. An insulating oxide layer 14, for example silicon dioxide, is grown on the entire surface of semiconductor substrate 12. The insulating oxide layer has a thickness of 100–500 nm. Next, silicon layer 16 is shown formed on top of the entire surface of insulating oxide layer 14. The silicon layer 16 has a thickness ranging from 50 nm to 300 nm. The preferred thickness is approximately 200 nm. It will be appreciated that silicon layer 16 and insulating oxide layer 14 together constitute SOI structure 11.

The SOI structure 11 may be provided by any conventional technique for fabricating SOI structures. For example, the SOI structure 11 may be formed by implanting a high concentration of oxygen in substrate 12 by a conventional separation-by-implanted-oxygen (SIMOX) technique. Alternatively, the SOI structure 11 may be formed by a conventional bond and etch back process.

It will be appreciated that the present invention, unlike conventional processes, makes SOI over the entire surface of substrate 12. Consequently, there is no need to form SOI islands as is done in conventional processes. In addition, there is no limitation to the width of the SOI island.

A thin pad oxide layer 18, for example silicon dioxide, is grown on the entire surface of silicon layer 16. The pad oxide layer 18 has a thickness ranging from 5 nm to 20 nm, and preferably of 10 nm. Next, nitride is deposited on top of pad oxide layer 18 to form nitride layer 20, as shown in FIG. 2b. The thickness of nitride layer 20 ranges from 100 nm to 500 nm. Pad oxide layer 18 reduces the stress between nitride layer 20 and silicon layer 16.

Figure 2C:
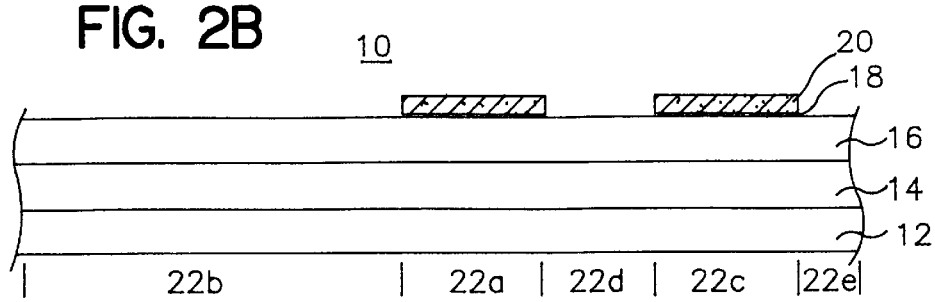

By methods well known in the art, a photoresist (not shown) is formed on top of the nitride layer. The photoresist is then patterned into a mask using, for example, conventional photolithographic techniques. The top nitride layer 20 is then selectively removed using reactive ion etching (RIE). After removal, as shown in FIG. 2c, the regions covered by the nitride layer 20 on the SOI wafer remain as SOI regions, for example, 22a and 22c, and the uncovered regions will be used to form either shallow trench isolation regions or will be used as bulk silicon regions.

Figure 2D:
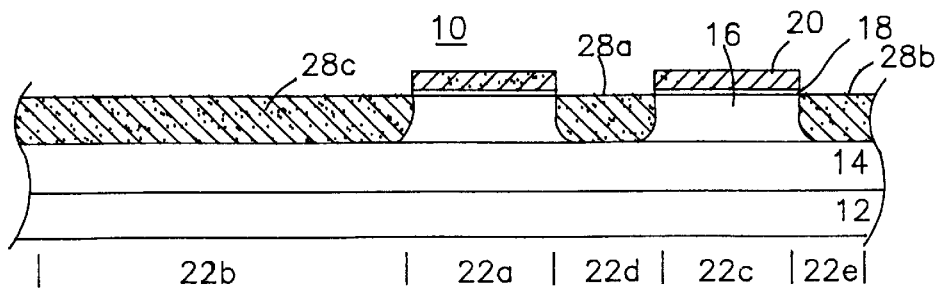

Using the same patterned photoresist mask and selective RIE, the silicon layer 16 is removed in regions 22b, 22d, and 22e, all the way down to the buried oxide layer 14. Next, shallow trench isolation (STI) is defined to bound the SOI regions 22a and 22c. STI areas 28a and 28b isolate regions 22c from 22a, while STI areas 28a and 28c isolate region 22a, as shown in FIG. 2d.

Figure 2E:
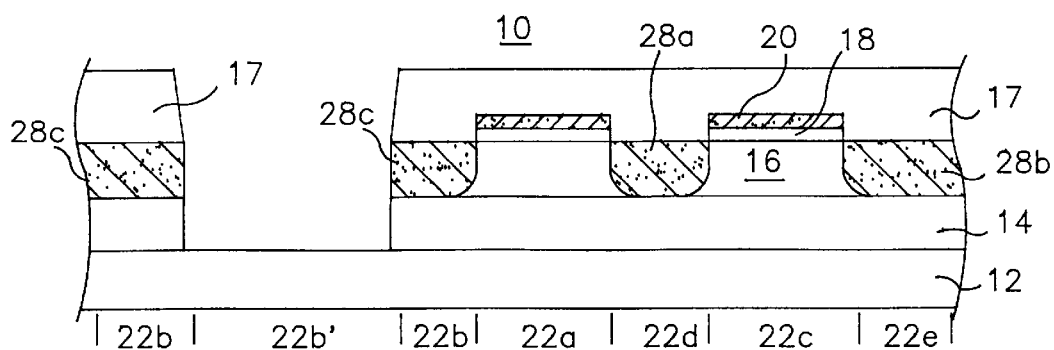
Figure 2F:
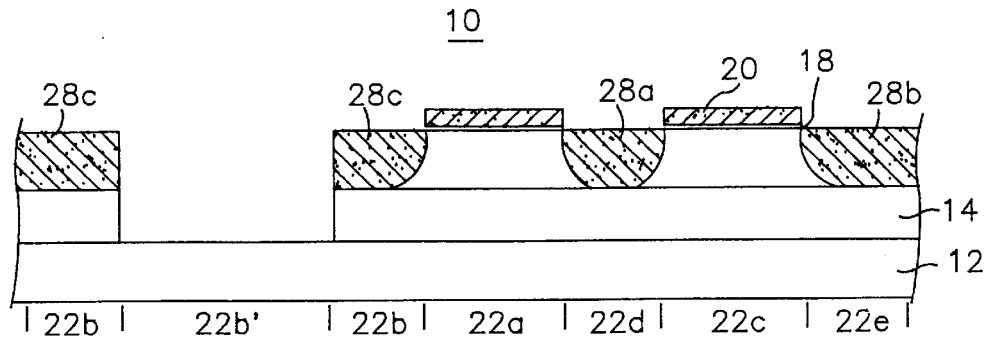

Now referring to FIG. 2e, a photoresist mask 17 is patterned into a mask using a conventional photolithographic technique. The exposed STI region 28c is etched using reactive ion etching (RIE). The etch is continued through the buried oxide layer 14, all the way to expose substrate 12 of wafer 10 in region 22b'. Next, photoresist mask 17 is removed by a conventional technique and the wafer 10 is cleaned. The resultant structure is shown in FIG. 2f.

The next steps in the process are the cleaning of the exposed substrate 12 by using standard cleaning techniques, and the annealing of wafer 10 at high temperatures (between 1000° C.–1100° C.) to repair the silicon damaged by the REI process. During annealing, a thin layer of oxide (not shown), for example silicon dioxide, is grown on top of the exposed substrate 12. The thin oxide layer has a thickness of approximately 10 nm. Next, the thin oxide layer is removed by using hydrofluoric (HF) solution, again resulting in exposing substrate 12.

It will be appreciated that high-quality silicon may be grown on the part of wafer 10 that has exposed silicon substrate 12, namely region 22b', but not on the regions covered by nitride layer 20 or STI areas 28a, 28b, and 28c. The grown silicon is shown as epitaxial layer 26 in FIG. 2g. The thickness of epitaxial layer 26 may be adjusted such that its top surface is planar with nitride layer 20. Although not shown, the surface of epitaxial layer 26 may be planarized using chemical-mechanical polishing, for example by using nitride layer 20 as a stopping layer during polishing.

Figure 2G:
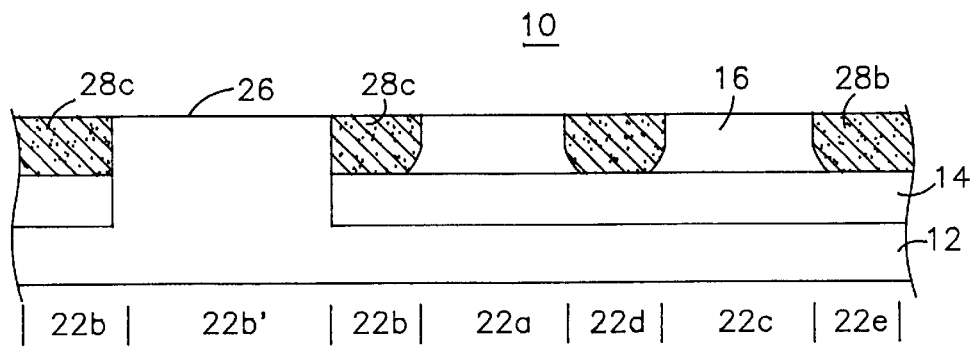

Next, nitride layer 20 is stripped using hot phosphoric acid and pad oxide layer 18 is removed using HF solution. The result of this step is shown in FIG. 2g. Finally, wafer 10 may be annealed at a high temperature (between 1000° C.–1100° C.) to fix any damage resulting after the epitaxial deposition. The resulting wafer shown in FIG. 2g has regions 22a and 22c with silicon on buried oxide (SOI) and region 22b' without a buried oxide. Region 22b' forms the bulk region which is surrounded by STI regions 22b.

Figure 2H:
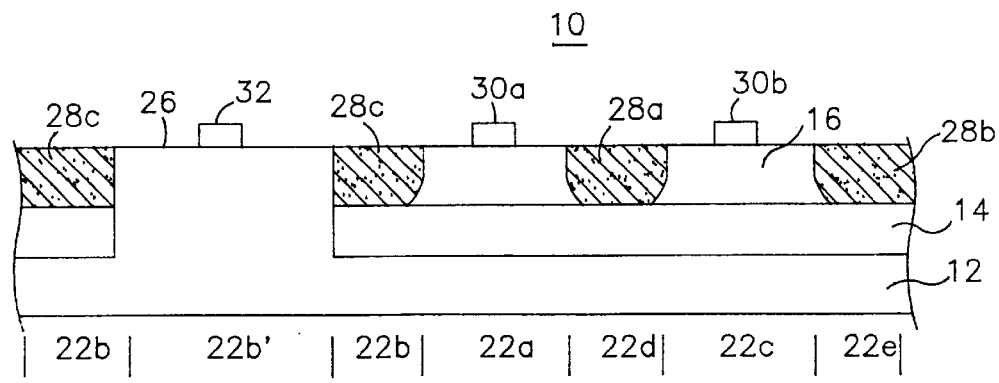

Wafer 10 is now ready for fabricating circuitry in a conventional manner. For example, DRAM components such as cell 32 (FIG. 2h) may be fabricated on the epitaxial layer 26 in region 22b', which has a common substrate and, therefore, does not having floating body effects. Logic components, such as 30a and 30b, may be fabricated on the SOI regions 22a and 22c.

It will now be appreciated that the inventors have developed a new process for making SOI and non-SOI (bulk) regions on a wafer. Because the inventors first start with SOI on the entire substrate and then make bulk regions selectively on the substrate, the SOI has no transitions in which defects may be formed at the patterned edges. Consequently, the SOI regions may be densely patterned.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to only making merged logic and DRAM circuitry on a wafer. Rather, the invention may be extended to any other type of circuit which may be densely patterned on SOI regions and any other type of circuit which may be patterned on bulk regions.

What is claimed is:

1. A semiconductor device including a silicon-on-insulator region and a bulk region made by a process comprising the steps of:
   (a) providing a silicon-on-insulator structure, the silicon-on-insulator structure having a thin silicon layer, a buried insulating oxide layer underlying the thin silicon layer, and a silicon substrate underlying the buried insulating oxide layer;
   (b) forming a nitride layer on top of the silicon-on-insulator structure;
   (c) selectively etching portions of the nitride layer to expose the silicon-on-insulator structure, a portion of the nitride layer not etched forming the silicon-on-insulator region; and forming a shallow trench isolation to bound the silicon-on-insulator region;
   (d) selectively etching a portion of the exposed silicon-on-insulator structure to expose the silicon substrate;
   (e) growing an epitaxial layer on top of the exposed silicon substrate to form the bulk region, the epitaxial layer contacting the shallow trench isolation formed in step (c); and
   (f) removing the nitride portion above the silicon-on-insulator structure.

2. The semiconductor device of claim 1 wherein step (a) includes implanting a high concentration of oxygen into the substrate to form the insulating oxide layer.

3. The semiconductor device of claim 1 wherein step (b) includes forming a pad oxide layer on top of the silicon-on-insulator structure prior to forming the nitride layer.

4. The semiconductor device of claim 1 wherein step (f) further includes forming a first type of circuit above the silicon-on-insulator region and a second type of circuit above the bulk region.

5. The semiconductor device of claim 4 wherein the first type of circuit is a logic circuit and the second type of circuit is a DRAM circuit.

6. The semiconductor device of claim 4 wherein step (d) further includes annealing the semiconductor device at a temperature between 1000° C.–1100° C. after the silicon substrate is exposed.

7. The semiconductor device of claim 4 wherein etching includes reactive ion etching.

8. A wafer including a patterned silicon-on-insulator for merged logic and DRAM circuitry made by a process comprising the steps of:
   (a) providing a silicon-on-insulator structure, the silicon-on-insulator structure having a thin silicon layer, a buried insulating oxide layer underlying the thin silicon layer, and a silicon substrate underlying the buried insulating oxide layer;
   (b) forming a nitride layer on top of the silicon-on-insulator structure;
   (c) selectively etching portions of the nitride layer to expose the silicon-on-insulator structure, a portion of the nitride layer not etched forming a silicon-on-insulator region;
   (d) selectively etching a portion of the exposed silicon-on-insulator structure to expose the silicon substrate;
   (e) growing an epitaxial layer on top of the exposed silicon substrate to form a bulk region;
   (f) removing the nitride portion above the silicon-on-insulator structure; and
   (g) forming the logic circuitry above the silicon-on-insulator region and the DRAM circuitry above the bulk region.

9. The wafer of claim 8 wherein step (a) includes implanting a high concentration of oxygen into the substrate to form the insulating oxide layer.

10. The wafer of claim 8 wherein step (b) includes forming a pad oxide layer on top of the silicon-on-insulator structure prior to forming the nitride layer.

11. The wafer of claim 8 wherein step (c) includes forming a shallow trench isolation to bound the silicon-on-insulator region.

12. The wafer of claim 8 wherein step (d) further includes annealing the wafer at a temperature between 1000° C.–1100° C. after the silicon substrate is exposed.

13. The wafer of claim 8 wherein etching includes reactive ion etching.

14. A semiconductor device including a silicon-on-insulator region and a bulk region made by a process comprising the steps of:
   (a) providing a silicon-on-insulator structure, the silicon-on-insulator structure having a thin silicon layer, a buried insulating oxide layer underlying the thin silicon layer, and a silicon substrate underlying the buried insulating oxide layer;
   (b) forming a nitride layer on top of the silicon-on-insulator structure;
   (c) selectively etching portions of the nitride layer to expose the silicon-on-insulator structure, a portion of the nitride layer not etched forming the silicon-on-insulator region;
   (d) selectively etching a portion of the exposed silicon-on-insulator structure to expose the silicon substrate;
   (e) growing an epitaxial layer on top of the exposed silicon substrate to form the bulk region; and
   (f) removing the nitride portion above the silicon-on-insulator structure to form a first type of circuit above the silicon-on-insulator region and a second type of circuit above the bulk region, wherein the first type of circuit is a logic circuit and the second type of circuit is a DRAM circuit.

* * * * *